US009425254B1

(12) United States Patent
Gross et al.

(10) Patent No.: US 9,425,254 B1
(45) Date of Patent: Aug. 23, 2016

(54) HYBRID INTEGRATED NANOTUBE AND NANOSTRUCTURE SUBSTRATE SYSTEMS AND METHODS

(75) Inventors: Matthew L. Gross, Boulder, CO (US); James H. Eraker, Boulder, CO (US); Beth H. Kelsic, Longmont, CO (US); Bevan Staple, Longmont, CO (US)

(73) Assignee: BALL AEROSPACE & TECHNOLOGIES CORP., Boulder, CO (US)

( * ) Notice: Subject to any disclaimer, the term of this patent is extended or adjusted under 35 U.S.C. 154(b) by 238 days.

(21) Appl. No.: 13/439,651

(22) Filed: Apr. 4, 2012

(51) Int. Cl.
*H01L 29/06* (2006.01)
(52) U.S. Cl.
CPC .................................. *H01L 29/0673* (2013.01)
(58) Field of Classification Search
USPC ......................................... 257/E51; 977/742
See application file for complete search history.

(56) References Cited

U.S. PATENT DOCUMENTS

| 7,541,216 | B2  |   | 6/2009  | Yates et al. |
| 8,399,339 | B2  | * | 3/2013  | Lieber et al. ................. 438/478 |
| 2002/0175408 | A1 | * | 11/2002 | Majumdar et al. ............ 257/734 |
| 2004/0075464 | A1 | * | 4/2004  | Samuelson ............ B82Y 10/00 326/37 |
| 2006/0057360 | A1 | * | 3/2006  | Samuelson ............ B82Y 20/00 428/323 |
| 2007/0003472 | A1 | * | 1/2007  | Tolt ............................ 423/447.3 |
| 2008/0288067 | A1 | * | 11/2008 | Flood .......................... 623/6.63 |
| 2009/0020150 | A1 |   | 1/2009  | Atwater et al. |
| 2009/0020853 | A1 |   | 1/2009  | Kayes et al. |
| 2010/0059736 | A1 |   | 3/2010  | Tombler, Jr. |
| 2011/0129714 | A1 |   | 6/2011  | Kelzenberg et al. |
| 2013/0044405 | A1 | * | 2/2013  | Brambilla et al. ............ 361/502 |

OTHER PUBLICATIONS

"Hybrid Silicon/Carbon Nanotube Heterostructures for Reversible High-Capacity Lithium-Ion Anodes," InterNano, Jan. 26, 3 pages.
"Piece of Cake: Arrays of Long Nanotubes May Help Measure Terahertz Lazer Power," NIST Tech Beat, Jul. 19, 2011, 1 page, found online at (http://www.nist.gov/pml/div686/laser-071911.cfm).
Chen et al. "A nanoelectronic nose: a hybrid nanowire/carbon nanotube sensor array with integrated micromachined hotplates for sensitive gas discrimination," Nanotechnology, Mar. 2009, vol. 20, 8 pages.
Englander et al. "Local synthesis of silicon nanowires and carbon nanotubes on microbridges," Applied Physics Letters, Jun. 2003, vol. 82, No. 26, pp. 4797-4799.
Genzer et al. "Recent developments in superhydrophobic surfaces and their relevance to marine fouling: a review," Biofouling, 2006, vol. 22, No. 5, pp. 339-360.
Kalita et al. "Silicon nanowire array/polymer hybrid solar cell incorporating carbon nanotubes," Journal of Physics D: Applied Physics, May 2009, vol. 42, 115104, 5 pages.

(Continued)

*Primary Examiner* — Fernando L Toledo
*Assistant Examiner* — Lawrence-Linh T Nguyen
(74) *Attorney, Agent, or Firm* — Sheridan Ross P.C.

(57) ABSTRACT

Systems and methods for providing a hybrid integrated nanostructure and nanotube substrate system are disclosed. The system includes a substrate having a plurality of nanostructures formed thereon. Interconnected to the substrate, directly or through nanostructures, are nanotubes. The nanostructures can extend for a greater distance from the surface of the substrate than the nanotubes, providing a robust structure. In addition, the structure can be highly emissive and absorptive hybrid surface.

21 Claims, 4 Drawing Sheets

(56) References Cited

OTHER PUBLICATIONS

Kelzenberg et al. "Enhanced absorption and carrier collection in Si wire arrays for photovoltaic applications," Nature Materials, Mar. 2010, vol. 9, pp. 239-244.

Li "Solar Cell with Graphene and Carbon Nanotube Hybrid Systems," Apr. 2010, 16 pages, found online at: (phys570x.wikispaces.com/file/view/Proposal+write-up.pdf).

Lu et al. "Hybrid platinum/single-wall carbon nanotube nanowire actuators: metallic artificial muscles," Nanotechnology, Jan. 2006, vol. 17, pp. 888-894.

Roach et al. "Progess in superhydrophobic surface development," Soft Matter, 2008, vol. 4, No. 2, pp. 224-240.

Rothstein "Slip on Superhydrophobic Surfaces," Annual Review of Fluid Mechanics, Jan. 2010, vol. 42, pp. 89-109.

Shang et al. "Nanostructured superhydrophobic surfaces," Journal of Materials Science, 2005, vol. 40, pp. 3587-3591.

Wang et al. "Nanostructured Hybrid Silicon/Carbon Nanotube Heterostructures: Reversible high-Capacity Lithium-Ion Anodes," ACS Nano, 2010, vol. 4, No. 4, pp. 2233-2241 (Abstract Only).

Xue et al. "Large-area fabrication of superhydrophobic surfaces for practical applications: an overview," Science and Technology of Advanced Materials, Jul. 2010, vol. 11, 15 pages.

\* cited by examiner

HYBRID INTEGRATED NANOTUBE AND NANOSTRUCTURE SUBSTRATE SYSTEMS AND METHODS

FIELD

Hybrid integrated carbon nanotube and nanostructure substrate systems and methods are disclosed. More particularly, hybrid structures incorporating nanostructures and nanotubes on a surface of a substrate are disclosed.

BACKGROUND

Structures incorporating nanotubes on a surface of a substrate have been proposed or developed for various applications. For example, such structures can be used in thermal arrays. In particular, arrays that feature excellent absorption properties in wavelengths from the visible to the far infrared can be created.

In various applications, it is desirable to provide structures with selected thermal absorption properties, and that also are relatively robust. For example, energy absorbing materials for incorporation into spacecraft and/or instruments carried by spacecraft are required to be mechanically robust, in order to survive pre-launch cleaning procedures, launch itself, and to provide a suitable service life once deployed. As a further example, energy absorbing materials used on the hulls of surface ships or submarines are preferably capable of maintaining certain minimal levels of energy absorption over extended time periods during deployments at sea. Such energy absorbing materials have included engineered coatings applied to baffles, sensors, external vehicle surfaces, or other surfaces. However, existing materials are often relatively fragile. In addition, improvements in electromagnetic absorption, control over the selectivity of electromagnetic absorption, or control over reflectance, etc., would be desirable.

Various structures have been developed that incorporate nanowires and/or nanotubes. For example, devices incorporating semiconducting single walled carbon nanotube (SWNT) field effect transistors (FETs) have been used in combination with semiconducting metal oxide nanowire sensors in chemical sensor systems that take advantage of the different redox responses of the different materials for improved selectivity. Other systems have proposed combinations of nanorods, semiconducting nanowires, and nano-particles in solar cells. In at least some of these systems, free standing silicon nanowires have been combined with a polymer incorporating carbon nanotubes. However, the performance of such structures in connection with electromagnetic absorption is limited. In particular, the use of a polymer containing nanotubes can exhibit less than desirable thermal properties. In addition, such compositions promote the scattering and reflection of light, which is an undesirable feature for light absorbing applications.

Still other systems have been proposed that utilize silicon wire arrays for solar energy harvesting applications. Such arrays have been reported as providing up to 96% peak absorption. However, various applications require even greater absorption characteristics. Alternatively, systems have been proposed that use carbon nanotubes to increase the efficiency of solar cells. Moreover, systems that combine a film of carbon nanotubes and an array of silicon nanowires have been proposed for use in photoelectron chemical cells. However, the electromagnetic absorption and thermal characteristics of such devices is not sufficiently high for certain applications. In addition, systems that incorporate nanotube structures can be vulnerable to damage.

SUMMARY

Embodiments of the present disclosure are directed to solving these and other problems and disadvantages of the prior art. In particular, systems and methods for providing a surface having enhanced mechanical robustness, wavelength selectivity, and electromagnetic radiation (EM) emission or absorption properties are provided. A hybrid structure in accordance with embodiments of the present invention generally includes a plurality of nanostructures extending from a surface of a substrate, and a plurality of carbon nanotubes interconnected or attached to the substrate surface and/or the nanostructures. The nanostructures can comprise nanowires. The nanostructures can further comprise a silicon nanowire array that provides mechanical and antireflection protection for the substrate. The nanostructures can be oriented such that they are orthogonal or nearly orthogonal to the surface of the substrate. In accordance with further embodiments of the disclosed invention, the nanostructures and nanotubes are electrically conductive. A structure in accordance with embodiments of the present invention can feature extremely low electromagnetic (EM) reflectance and high EM absorptivity, to provide a surface for use in connection with stray light absorption, black bodies, light sinks, sensors, and the like. In addition, the surface can be highly absorptive of photons from x-ray to the far UV and highly emissive, and can serve as a high-performance radiator from high temperatures (e.g., 500K) to low temperatures (e.g., 40K). Embodiments of the present disclosure can provide an absorbing material that can be used on the surfaces of vehicles or sensors.

The nanostructures can be dimensioned such that they have a diameter that is less than one quarter the wavelength of the electromagnetic energy or a component of the electromagnetic energy to be absorbed. The nanostructures can also be electrically conductive. In embodiments in which the nanotubes are interconnected to the substrate, they can be oriented such that they are orthogonal or nearly orthogonal to the surface of the substrate. Moreover, the nanotubes can have a length that is less than the length of the nanostructures, such that most or all of the nanostructures extend a greater distance from the surface of the substrate than the nanotubes. In embodiments in which the nanotubes are interconnected to the electrically conductive nanostructures, one end of each nanotube can be interconnected to a nanostructure. Moreover, each nanotube can be non-parallel to the interconnected electrically conductive nanostructure. In accordance with still other embodiments, at least some of the nanotubes can be interconnected to the surface of the substrate, while others of the nanotubes can be interconnected to a nanostructure.

Methods in accordance with embodiments of the present disclosure can be used to produce a surface having enhanced mechanical robustness, high wavelength selectivity, and high electromagnetic radiation emission or absorption properties. In accordance with at least some embodiments, an electrically conductive substrate is provided. As an example, and without limitation, the substrate can comprise a doped silicon substrate. A plurality of nanostructures, such as but not limited to nanowires, are formed on the substrate. The formation of the nanostructures can include the application of semiconductor manufacturing techniques, including deposition and etching procedures. As an example, and without limitation, the nanostructures can comprise doped silicon structures. After forming the nano-structures, the nanotubes are added. More particularly, the nanotubes can be synthesized to the surface of the substrate. This can include growing the nanotubes using thermal chemical vapor deposition techniques. The nanotubes can be grown such that they extend from the substrate vertically (i.e., such that they are orthogonal or nearly orthogonal to the surface of the substrate), and/or such that they extend from the surface of the nanostructures. Alternatively, preformed nanotubes can be deposited onto the surface of the substrate and/or the surfaces of the nanowires. The nanotubes may comprise carbon nanotubes, including but not limited to multiwall nanotubes. In accordance with still other embodiments, antenna elements and electronics can be patterned on a silicon substrate and the silicon nanowires can be added through vapor-liquid-solid (VLS) synthesis or an analogous process.

In accordance with further embodiments of the present disclosure, the hybrid integrated carbon nanotube and nanostructure substrate system can incorporate one or more coatings. The one or more coatings can be selected to reduce reflectance and/or reduce the surface energy of the coated structures. In accordance with further embodiments, the nanostructures can be treated such that they are hydrophobic or super hydrophobic. In accordance with still other embodiments, the nanostructures can be treated to provide a hydrophobic surface, while the nanotubes could be treated to provide a hydrophilic surface. Moreover, a structure incorporating electrically conductive hydrophobic nanostructures and hydrophilic nanotubes can be interconnected to a voltage source, to allow for electro-wetting/dewetting. By providing a structure with alternating hydrophobic and hydrophilic surfaces, biofouling in a water environment can be reduced.

Additional features and advantages of embodiments of the present disclosure will become more readily apparent from the following description, particularly when taken together with the accompanying drawings.

DETAILED DESCRIPTION

Figure 1:
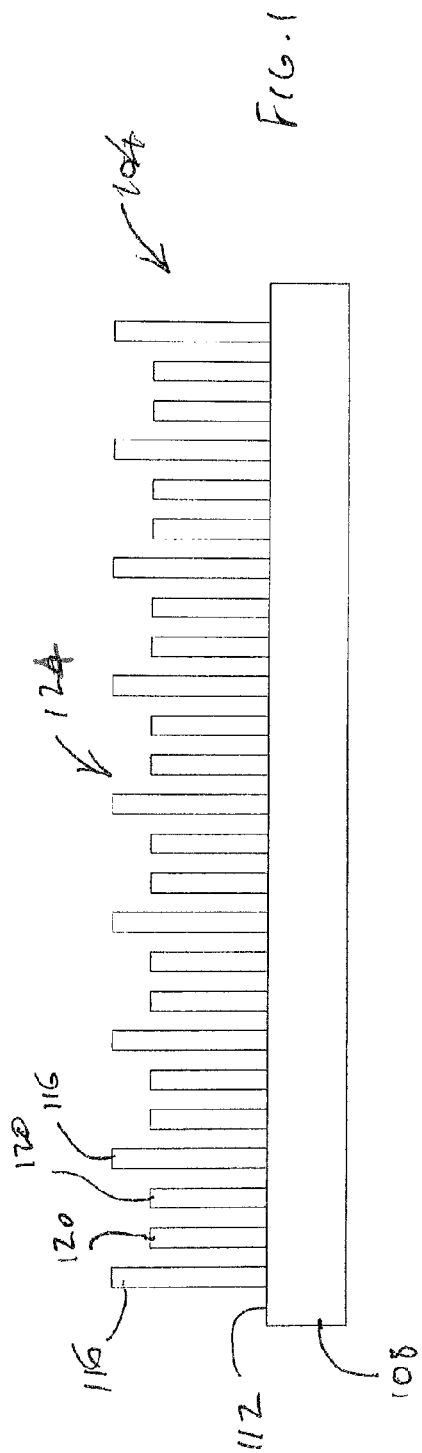
FIG. 1 depicts a hybrid integrated nanostructure and nanotube substrate system in accordance with embodiments of the present disclosure in elevation.

FIG. 1 depicts a hybrid integrated nanotube and nanostructure substrate system or hybrid substrate system 104 in accordance with embodiments of the present disclosure in elevation. The hybrid substrate system 104, also referred to herein as hybrid structure 104, generally includes a substrate 108 having at least a first surface 112. Interconnected to the first surface 112 are a plurality of nanostructures 116. More particularly, the nanostructures 116 have a first end that is interconnected to the surface 112 of the substrate 108. Moreover, the nanostructures 116 generally extend from the first end at the surface 112 along a length to a second end that is distal from the surface, and can be oriented such that a longitudinal axis of each nanostructure 116 is at a non-zero angle with respect to the surface 112 of the substrate 108. The hybrid substrate system 104 additionally includes a plurality of nanotubes 120. The nanotubes 120 can have a first end that is interconnected to the surface 112 of the substrate 108. Moreover, the nanotubes 120 are at a non-zero angle with respect to the surface 112 of the substrate 108. In accordance with embodiments of the present disclosure, the nanostructures 116 and the nanotubes 120 can be aligned vertically or substantially vertically (e.g., within ±10° of being orthogonal to the surface 112 at the attachment point) with respect to the surface 112 of the substrate 108. In addition, the nanostructures 116 have a second or free end that is a first distance or less from the surface 112 of the substrate 108, while the nanotubes 120 have a second or free end that is a second distance or less from the surface 112 of the substrate 108. Moreover, the first distance is greater than the second distance. The nanostructures 116, which are generally more robust than the nanotubes 120, can therefore bear the brunt of mechanical forces acting on the hybrid substrate system 104. The substrate surface 112 can be partially covered by the nanostructures 116 and nanotubes 120. For example, from 2%-10% of the surface 112 can be covered by a nanostructure 116 and/or a nantube 120. As a further example, from about 4% to about 40% of the surface can be covered by a nanostructure 116 and/or a nanotube 120. In accordance with further embodiments, about 5% (±1%) of the surface 112 can be covered by a nanostructure 116 and/or a nanotube 120. Moreover, areas of the substrate 108 surface 112 that are not covered by nanostructures 116 or nanotubes 120 are available for other structures or devices. Together, the substrate 108, substrate surface 112, nanostructures 116, and nanotubes 120 can provide an engineered or hybrid surface 124 that features low electromagnetic (EM) reflectance, and high EM emission or absorption properties.

Figure 2:
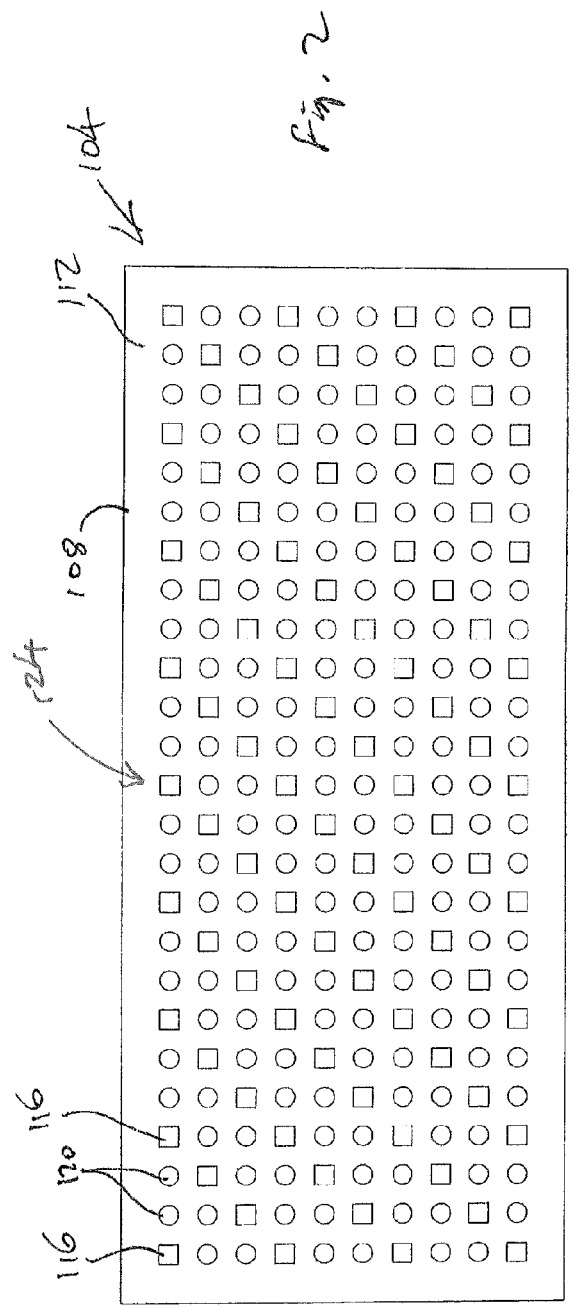
FIG. 2 depicts the hybrid integrated nanostructure and nanotube substrate system of FIG. 1 in plan view.

FIG. 2 depicts the hybrid substrate structure 104 of FIG. 1 in a top plan view. As shown, the nanotubes 120 can be interspersed among the nanostructures 116. In addition, the nanostructures 116 and the nanotubes 120 can have a relatively small diameter or area. For example, the nanostructures 116 can have a diameter or area that is less than ¼ a wavelength of interest in diameter. For instance, the diameter or area of the nanostructures 116 can be within a range of about 3-70 nm. Larger diameter or area structures can be used to provide more mechanical robustness and a low friction surface; however more electromagnetic energy will be reflected from the surface as compared to smaller diameter or area structures. As a further example, the nanotubes 120 can have a diameter that is less than $\frac{1}{30}^{th}$ the wavelength of interest in diameter. For instance, the diameter of the nanotubes 120 can be within a range of about 6-10 nm.

The lengths of the nanostructures 116 and nanotubes 120 can be selected in view of the wavelength or wavelengths for which absorption by the hybrid surface 124 is desired. In a typical light absorbing application, the nanostructures 116 might have a length of about 10 wavelengths or more, while the nanotubes 120 might have a length of about 10 wavelengths or more.

The substrate 108 may comprise a silicon substrate. Moreover, the substrate 108 may be doped to provide electrical conductivity. Other examples of suitable substrate 108 materials include but are not limited to titanium, mica, aluminum, copper, or doped semiconductors.

The nanostructures 116 may comprise silicon or other semiconductor structures that are grown on the surface 112 of the substrate, for example using subtractive etching or additive chemical vapor deposition processes. The semiconductor material can be doped to provide electrical conductivity. Accordingly, conventional semiconductor manufacturing techniques can be used to form the nanostructures 116. The nanotubes 120 may comprise carbon nanotubes (CNTs) that are grown on the nanostructures 116 and/or the surface 112 of the substrate 108. Alternatively or in addition, the nanotubes 120 may comprise pre-formed tubes that are deposited or otherwise provided onto the nanostructures 116 and/or the surface 112 of the substrate 108. In accordance with still other embodiments, the nanostructures 116 and nanotubes 120 can be chemically coated to provide desired surface properties, including light absorption, reduced surface tension, hydrophobicity, hydrophilicity, etc.

Figure 3:
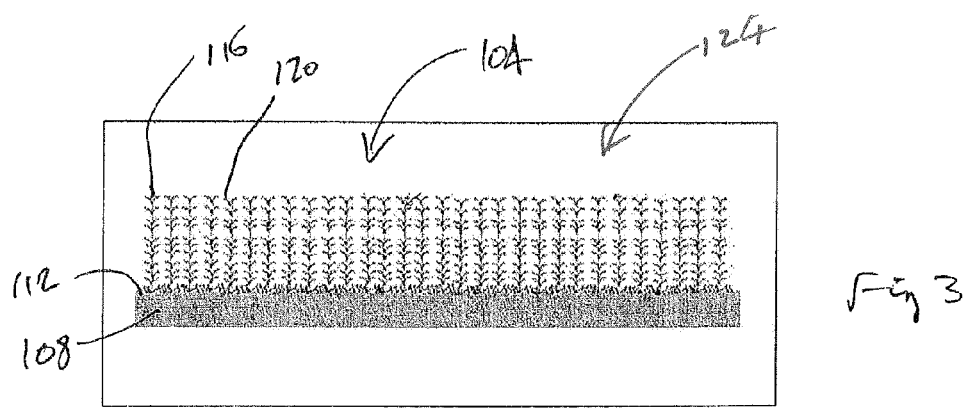
FIG. 3 depicts a hybrid integrated nanostructure and nanotube substrate system in accordance with other embodiments of the present disclosure in elevation.

FIG. 3 depicts a hybrid substrate system 104 in accordance with further embodiments of the present invention in elevation. In this variation, a hybrid surface 124 is provided in which nanotubes 120 are interconnected to nanostructures 116, as well as to the surface 112 of the substrate 108. In general, the nanotubes 120 therefore have a first end that is joined to the surface 112 of the substrate 108 or to a nanostructure 116, and a second, free end. In such embodiments, the lengths of the nanostructures 116 are generally several times greater than the lengths of the individual nanotubes 120. In addition, although the second ends of some nanotubes 120 may extend to a distance from the surface 112 of the substrate 108 greater than the distance that the second ends of the nanostructures 116 extend, the majority of the nanotubes 120 have second ends that do not extend farther from the surface 112 than the second ends of the nanostructures 116. Accordingly, most of the nanotubes 120 are protected by the nanostructures 116.

Figure 4:
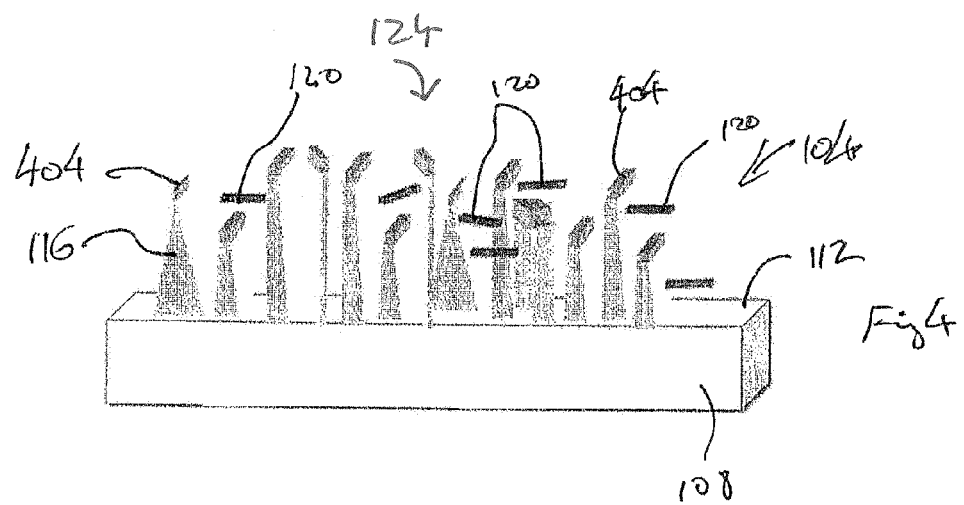
FIG. 4 depicts a hybrid integrated nanostructure and nanotube substrate system in accordance with other embodiments of the present disclosure in elevation.

FIG. 4 is a perspective view of a hybrid substrate system 104 that provides a hybrid surface 124 in accordance with still other embodiments of the disclosed invention. In this example, the nanostructures 116 comprise tapered elements. For example, from a first end or base interconnected to the surface 112 of the substrate 108, the nanostructures 116 can taper, such that the cross-section of the nanostructure 116 in at least one dimension is reduced as the distance from the surface 112 of the substrate 108 increases. For instance, a typical nanostructure 116 can linearly taper from a base dimension (e.g. diameter or width) of about 70 nm to a tip dimension of about 60 nm. A linear taper is relatively easy to implement, and can provide improved performance as compared to nanostructures 116 with a constant cross-section. For optimum performance, the taper is gradual over the length of the nanostructure 116, and the nanostructure 116 is preferably relatively long. In accordance with still other embodiments, other tapers, such as exponential or other non-linear tapers, can be utilized. As shown, the nanostructures 116 can comprise elements of differing shapes, sizes and orientations. The nanotubes 120 are interconnected to the nanostructures 116. More particularly, a first end of each nanotube 120 is interconnected to a side surface of a nanostructure 116, while a second end of each nanotube 120 is free. Moreover, a longitudinal axis of the nanotubes 120, between the first and second ends, can be at any angle with respect to the surface 112 of the substrate 108. In addition, each nanostructure 116 can be associated with a coating 404. For example, the coating 404 may comprise a layer to increase electron mobility on the surface of the nanowires and exterior antireflection layers. Alternatively or in addition, the coating 404 can comprise a metallization.

Figure 5:
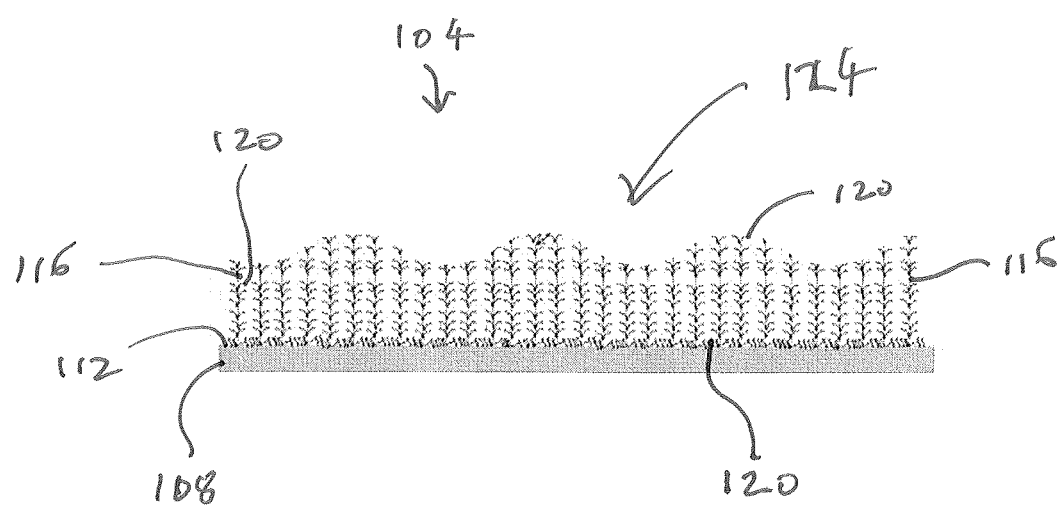
FIG. 5 depicts a hybrid integrated nanostructure and nanotube substrate system in accordance with other embodiments of the present disclosure in elevation.

FIG. 5 illustrates a hybrid substrate structure 104 in accordance with still other embodiments of the disclosed invention. More particularly, the substrate system 104 includes nanostructures 116 and nanotubes 120 having second ends that describe a hybrid surface 124 that is textured on a micron scale. This texturing can be used to reduce drag between the surface 104 and a fluid. Moreover, this texturing can comprise ribs, dimples, bumps or the like.

In accordance with still other embodiments, the nanostructures 116 and/or nanotubes 120 can be coated or otherwise treated to exhibit hydrophobic or hydrophilic properties. For example, coatings that reduce surface energy can be applied to the nanostructures 116 and the nanotubes 120 in order to provide a hybrid surface 124 that exhibits low drag within fluids, such as but not limited to water. Moreover, treatment of nanostructures 116 and nanotubes 120 for reduced surface tension and/or drag can be combined with a textured hybrid surface 124 to reduce drag. In accordance with still other embodiments, portions of the hybrid structure 104 can be treated to exhibit hydrophobic properties, while other portions can be treated to exhibit hydrophilic properties.

Hydrophobic and hydrophilic properties can be distributed across some or all of the hybrid surface in an alternating fashion. For example, the nanostructures 116 can be treated to exhibit a first one of a hydrophobic or a hydrophilic property, while the nanotubes 120 can be treated to exhibit a second one of a hydrophobic or hydrophilic property. By providing a hybrid surface with alternating hydrophobic and hydrophilic properties, biofouling in certain embodiments, such as a water environment, can be reduced.

Embodiments of the disclosed invention can additionally employ electro-wetting techniques. More particularly, by selectively creating a charge on the surface of the hybrid structure, liquids can be moved across the surface. Such movement can be used to periodically expel contaminants from the surface. Electro-wetting can also be used to move fluid across the surface, for example for propulsion purposes.

Figure 6:
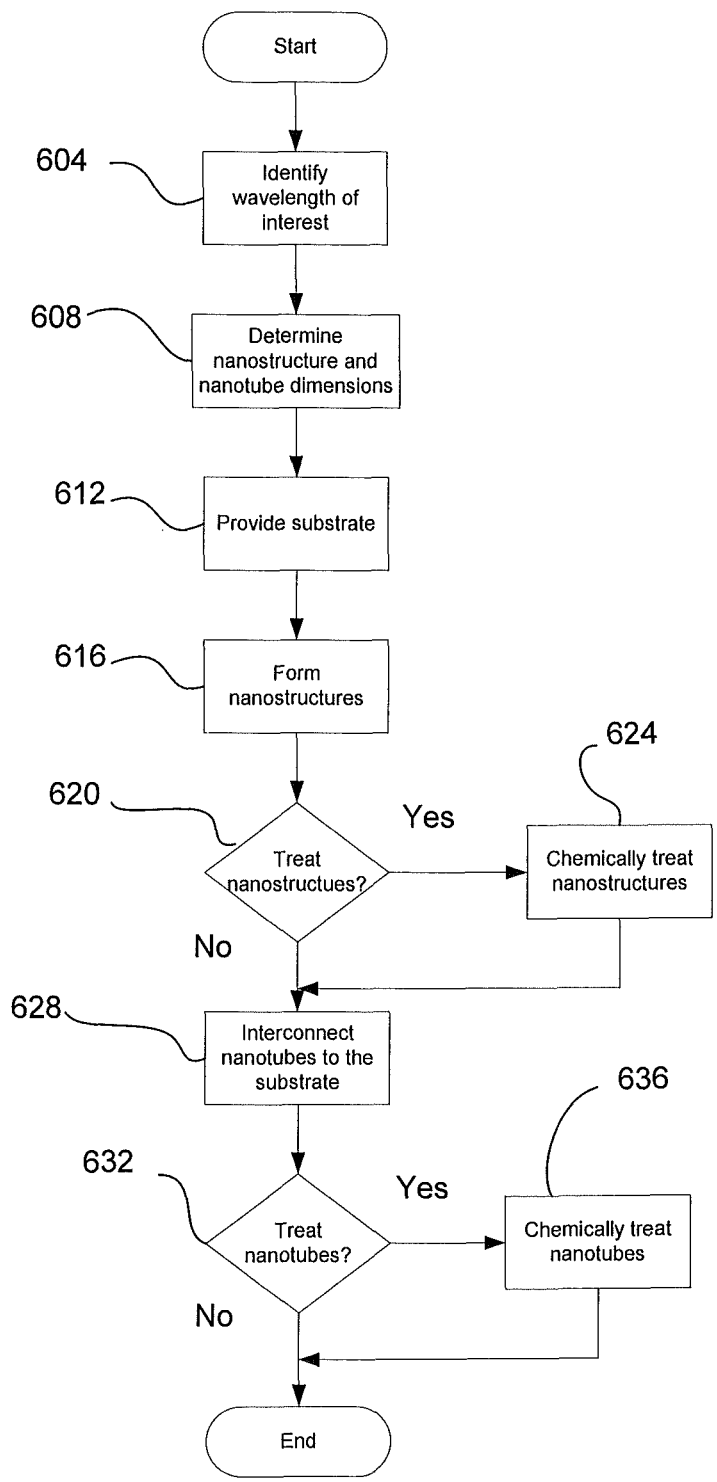
FIG. 6 depicts aspects of a method for providing a hybrid nanostructure and nanotube system in accordance with embodiments of the present disclosure.

With reference now to FIG. 6, aspects of a method for providing a hybrid integrated nanostructure and nanotube substrate system in accordance with embodiments of the present invention are depicted. Initially, at step 604, a wavelength or range of wavelengths of interest are identified. This can include identifying wavelengths for which excellent (e.g. in excess of 99%) absorption in desired. Next, the dimensions of the nanostructures 116 and nanotubes 120 can be determined (step 608). In general, the lengths of the nanostructures 116 and nanotubes 120 can be selected to have lengths that are some multiple of the wavelength or wavelengths of interest. The cross sectional areas of the nanostructures 116 and nanotubes 120 can be selected to be less than the length of the nanostructure 116 or nanotube 120.

At step 612, the substrate 108 is provided. The substrate 108 generally includes at least one surface 112 to which nanostructures 116 and/or nanotubes 120 will be interconnected. In accordance with at least some embodiments, the surface 112 may be planar. However, in other embodiments, the surface 112 may be curved or otherwise non-planar. In at least some embodiments, the substrate 104 comprises a silicon substrate. Moreover, the substrate 104 may be doped so that it is electrically conductive.

At step 616, nanostructures 116 are formed on the surface 112 of the substrate 104. The nanostructures 116 can be formed using semiconductor manufacturing techniques. Forming the nanostructures 116 can include placing the nanostructures 116 at selected sites on the surface 112 of the substrate 108, where the sites are each a selected distance from one another, according to a predetermined pattern. In accordance with other embodiments, the sites at which the nanostructures 116 are placed can be at least some minimum distance from one another. In accordance with still other embodiments, the nanostructures 116 can be placed at random sites on the surface 112. The nanostructures 116 can be formed from various materials. In general, the material used to form the nanostructures should be electrically conductive, or should be treated or coated to be electrically conductive. As an example, the nanostructures 116 can be formed from silicon or some other semiconductor material that is doped after the nanostructures 116 have been formed. In addition, the nanostructures 116 have a first end that is interconnected to the surface 112 of the substrate 104, and a second end that is some distance from the surface 112. For example, the nanostructures 116 may have a second end that is a first distance from the surface 112. In accordance with further embodiments, the nanostructures 116 may have second ends that are different distances from the surface 112. The nanostructures 116 may comprise nanowires that have a constant or substantially constant cross section along the length of the nanostructures 116. In accordance with further embodiments, the nanostructures 116 can comprise tapered elements, with the cross section decreasing with distance from the first end. In at least some embodiments, the nanostructures 116 can comprise tapered blocks or other forms.

At step 620, a determination can be made as to whether the surface of some or all of the nanostructures 116 should be chemically treated. For example, the surfaces of the nanostructures 116 can be treated to be hydrophobic, hydrophilic, or to provide low reflectance. In accordance with still other embodiments, the surfaces of some or all of the nanostructures 116 can be treated for increased charge carrying capability. If the surfaces of some or all of the nanostructures 116 are to be treated, such treatment can be performed at step 624.

At step 628, nanotubes 120 can be interconnected to the substrate 104. More particularly, a first end of each nanotube 120 is joined to the surface 112 of the substrate 108 or to a surface of a nanostructure 116. By joining an end of each nanotube 120 to either the surface 112 of the substrate 108 or to the surface of a nanostructure 116, each nanotube 120 can be electrically interconnected to the substrate 108. In addition, the nanotubes 120 are thermally connected to the substrate 108. The nanotubes 120 can be synthesized to the nanostructures 116 and/or the substrate 108 by growing the nanotubes 120 on the nanostructures 116 and/or the surface 112 of the substrate 108. In accordance with other embodiments, pre-formed nanotubes 120 can be interconnected to the nanostructures 116 and/or the surface 112 of the substrate 108. Moreover, the nanotubes 120 are dimensioned and arranged such that the maximum extent of the hybrid structure from the surface 112 of the substrate 108 is defined by the nanostructures 116, rather than the nanotubes 120. For example, where the nanostructures 116 have second ends that are no closer to the surface 112 than a first distance, most or all of the nanotubes 120 may have a second end that is within that first distance from the surface 112.

At step 632, a determination is made as to whether the surfaces of some or all of the nanotubes 120 are to be treated. Treatment can include chemically altering the nanotubes 120, and/or coating the nanotubes 120, to provide a hydrophobic, hydrophilic, or electrically conductive surface. Alternatively, the decision to treat the nanotubes 120, and/or treatment itself 120, can be performed prior to interconnecting the nanotubes 120 to the substrate 108. The process may then end.

A hybrid structure 104 in accordance with embodiments of the present invention can provide very high electromagnetic energy absorption and emission characteristics. This performance is achieved through the selection and engineering of the hybrid system components, which provide a gradual transition from air (with an index of refraction n=1), to that of the hybrid surface 124 (n=1.11). The effective index of refraction of the hybrid surface 124 at any height above the surface 112 of the substrate 108 and below the tops of the nanostructures 116 and nanotubes 120 is the average of these two indices of refraction.

More particularly, a substrate 104 formed from a silicon wafer will have an index of refraction of n=3.2, resulting in a reflectance of 40%. By subdividing the surface into arbitrary shapes using silicon nanostructures 116, the ergodic scattering absorption limit predicts the reflection is $100\%/2n^2$, which is about 5%. By tapering the nanostructures 120, this effect can be reduced by a factor of 10. More particularly, the nanostructures 116 form a broadband, wide angle of incidence, antireflection layer. The addition of carbon nanotubes 120 improves the antireflection properties of the hybrid's surface. The greatest improvement is achieved when the nanotubes 120 are oriented vertically with respect to the surface 112 of the substrate 108. In addition, since the light scattering cross-section of the nanotubes 120 is a very small addition to the total cross-section of the hybrid system 104, the index of refraction of the nanotubes 120 is comparable to air, and their absorptivity is higher than silicon, enhancing the performance of the hybrid structure 104 above that obtained by the use of nanostructures 116 alone. In addition, the nanotubes 120 will increase absorption at long infrared wavelengths, where silicon is transparent. Moreover, the absorption of the nanotubes 120 can be made large enough that discontinuities in the index of refraction of the silicon substrate are addressed. In addition, because the various components of the hybrid structure 104 described herein are in electrical and thermal contact with one another, emissivity is further enhanced as compared to alternate structures.

A hybrid substrate structure 104 providing a hybrid surface 124 in accordance with embodiments of the present disclosure is suitable for incorporation into various structures and applications. For instance, a hybrid structure 104 as disclosed herein can be used on the exterior surfaces of airplanes, ships, and submarines. In accordance with further embodiments, hybrid substrate systems 104 can be provided in connection with antenna systems or other electronic systems. In connection with such embodiments, electronic structures or devices can be formed on the substrate 108, in addition to the elements (i.e., the nanostructures 116 and nanotubes 120, either directly or through nanostructures 116) of the hybrid substrate system 104. For example, electronic devices, such as transistors, diodes, capacitors, resistors, phase shifters, amplifiers, conductive traces, or other elements can be formed on the substrate 108. Moreover, nanostructures 116 can be formed on the substrate 108 containing electronic devices or elements, after such devices or elements have been formed, for example using vapor-liquid-solid (VLS) synthesis of the silicon nanostructures or nanowires 116. As can be appreciated by one of skill in the art after consideration of the present disclosure, the addition of a hybrid substrate system 104 can provide protection and antireflection properties for antenna systems and/or sensor systems. In addition, hybrid substrate systems 104 in accordance with embodiments of the present disclosure provide excellent antireflection, mechanical support, radiation hardness, and high thermal conductivity properties, and can therefore be beneficially incorporated into any structure for which such properties are desirable.

The foregoing discussion of the invention has been presented for purposes of illustration and description. Further, the description is not intended to limit the invention to the form disclosed herein. Consequently, variations and modifications commensurate with the above teachings, within the skill or knowledge of the relevant art, are within the scope of the present invention. The embodiments described hereinabove are further intended to explain the best mode presently known of practicing the invention and to enable others skilled in the art to utilize the invention in such or in other embodiments and with various modifications required by the particular application or use of the invention. It is intended that the appended claims be construed to include alternative embodiments to the extent permitted by the prior art.

What is claimed is:

1. A structure, comprising:
   a substrate;
   a plurality of nanostructures, wherein the nanostructures are interconnected to and extend from a first surface of the substrate; and
   first and second pluralities of nanotubes, wherein the nanostructures have a longest dimension that is greater than a longest dimension of the nanotubes, wherein the nanotubes included in the first plurality of nanotubes have a first end that is in contact with a nanostructure included in the plurality of nanostructures, wherein at least some of the nanotubes included in the first plurality of nanotubes that have a first end in contact with a nanostructure included in the plurality of nanostructures extend from the nanostructure and have a second end that is not in contact with the nanostructure or with any other nanotube, wherein the nanotubes included in the second plurality of nanotubes have a first end that is in contact with the first surface of the substrate, and wherein at least some of the nanotubes included in the second plurality of nanotubes have a second end that is not in contact with the substrate, a nanotube, or with any other nanotube.

2. The structure of claim 1, wherein the nanostructures comprise nanowires, wherein the nanowires each have a first end and a second end, and wherein the first end of each of the nanostructures is interconnected to the first surface of the substrate.

3. The structure of claim 2, wherein the nanostructures each have a diameter, wherein for each nanostructure the distance between the first end and the second end of the nanostructure defines the length of the nanostructure, and wherein the diameter of each nanostructure is less than the length of the nanostructure.

4. A structure, comprising:
   a substrate;
   a plurality of nanostructures, wherein each of the nanostructures includes a first end that is directly connected to a first surface of the substrate; and
   a plurality of nanotubes, wherein the nanotubes include a first end that is directly connected to the first surface of the substrate, wherein at least most of the nanostructures are at a non-zero angle with respect to the first surface of the substrate, and wherein a second end of at least most of the nanostructures is a greater distance from the first surface of the substrate than a second end of each of the nanotubes.

5. The structure of claim 2, wherein at least most of the nanostructures are at a non-zero angle with respect to the first surface of the substrate, and wherein at least most of the nanotubes are at a non-zero angle with respect to the first surface of the substrate.

6. The structure of claim 2, wherein at least most of the nanostructures extend for a greater distance from the first surface of the substrate than the nanotubes.

7. The structure of claim 1, wherein the nanostructures occupy from about 2% to about 40% of an area of the first surface of the substrate.

8. The structure of claim 7, wherein the nanotubes occupy at least about 5% of an area of the first surface of the substrate.

9. The structure of claim 1, wherein the nanostructures comprise doped silicon.

10. The structure of claim 9, wherein the nanotubes comprise carbon.

11. A hybrid structure, comprising:
    a substrate; and
    a plurality of electrically conductive nanostructures interconnected to the substrate;
    a plurality of carbon nanotubes, wherein each of the carbon nanotubes is interconnected to at least one of the substrate or an electrically conductive nanostructure included in the plurality of electrically conductive nanostructures, wherein the electrically conductive nanostructures have a largest dimension that is greater than a largest dimension of the carbon nanotubes, and wherein the largest dimensions of at least some of the electrically conductive nanostructures varies from an adjacent nanostructure to describe a textured hybrid structure surface.

12. The hybrid structure of claim 11, wherein the electrically conductive nanostructures include nanowires.

13. The hybrid structure of claim 11, wherein the plurality of carbon nanotubes are directly connected to the substrate.

14. The structure of claim 4, wherein the nanostructures are formed from a different material than the nanotubes.

15. The structure of claim 4, wherein the nanostructures each have a diameter, wherein for each nanostructure the distance between the first end and the second end of the nanostructure defines the length of the nanostructure, and wherein the diameter of each nanostructure is less than the length of the nanostructure.

16. The hybrid structure of claim 11, wherein the plurality of carbon nanotubes are directly connected to the nanostructures.

17. A structure, comprising:
    a substrate;
    a plurality of nanostructures interconnected to the substrate, wherein a length of the nanostructures between a first end and a second end can be any value within a range of values, wherein for at least some of the nanostructures a length of the nanostructure is different than a length of an adjacent nanostructure, wherein the plurality of nanostructures together describe a textured surface; and
    a plurality of nanotubes interconnected to the plurality of nanostructures, wherein the nanotubes include first and second ends, wherein the first end of each of at least most of the nanotubes is connected to a surface of a nanostructure, and wherein the second end of the at least most of the nanotubes is a free end.

18. The structure of claim 17, wherein the nanostructures include silicon structures that are grown on a surface of the substrate.

19. The structure of claim 18, wherein the nanotubes are grown on surfaces of the nanostructures.

20. The structure of claim 17, wherein the nanostructures and the nanotubes describe a hybrid surface that is textured on a micron scale.

21. The structure of claim 1, wherein the nanostructures are not nanotubes.

* * * * *